United States Patent
Shionoiri et al.

(10) Patent No.: US 7,130,234 B2
(45) Date of Patent: Oct. 31, 2006

(54) SEMICONDUCTOR DEVICE

(75) Inventors: Yutaka Shionoiri, Kanagawa (JP);
Tomoaki Atsumi, Kanagawa (JP);
Kiyoshi Kato, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 10/994,259

(22) Filed: Nov. 23, 2004

(65) Prior Publication Data
US 2005/0128827 A1  Jun. 16, 2005

(30) Foreign Application Priority Data
Dec. 12, 2003  (JP)  ............... 2003-415184

(51) Int. Cl.
*G11C 7/00*  (2006.01)
(52) U.S. Cl. ........................... 365/203; 365/194
(58) Field of Classification Search ............... 365/203, 365/194
See application file for complete search history.

(56) References Cited
U.S. PATENT DOCUMENTS 5,828,612 A * 10/1998 Yu et al. ............. 365/203
6,160,733 A * 12/2000 Ebel ..................... 365/154
6,587,392 B1 * 7/2003 Ooishi ................. 365/230.03
6,667,921 B1 * 12/2003 Park .................... 365/203
6,856,563 B1 * 2/2005 Kim et al. ............ 365/203
2002/0007325 A1  1/2002 Tomon
2003/0169149 A1  9/2003 Ohki et al.
2005/0045729 A1  3/2005 Yamazaki

FOREIGN PATENT DOCUMENTS

| JP | 09-147555  | 6/1997 |
|----|------------|--------|
| JP | 11-086555  | 3/1999 |
| JP | 11-203867  | 7/1999 |
| JP | 2001-101888| 4/2001 |
| JP | 2001-143473| 5/2001 |

* cited by examiner

*Primary Examiner*—Son T. Dinh
*Assistant Examiner*—N Nguyen
(74) *Attorney, Agent, or Firm*—Fish & Richardson P.C.

(57) ABSTRACT

A semiconductor device includes a data holding unit, a precharge unit and a delay unit. The data holding unit includes a plurality of memory cells. The precharge unit includes a precharge potential line, a precharge signal line and a plurality of switches. The delay unit includes a plurality of transistors. In addition, the semiconductor device can further include one or both of an address selecting unit having a column-decoder and a row-decoder and a display unit having a plurality of pixels. Reading and writing of data can be accurately performed by preventing malfunction even with a delay in a selection of an address.

28 Claims, 9 Drawing Sheets

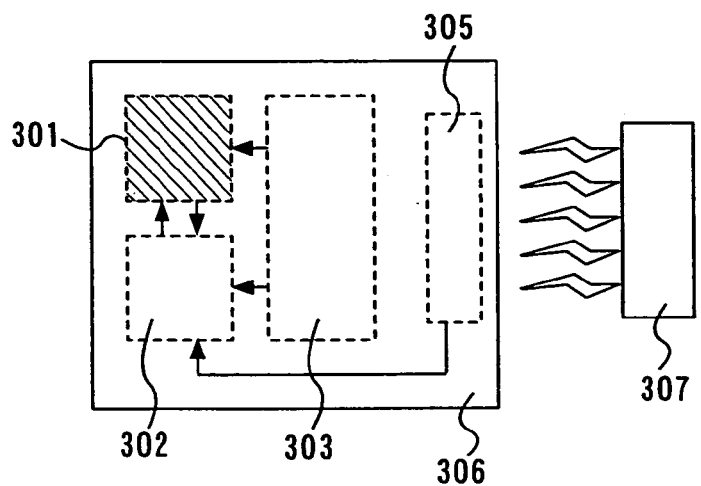 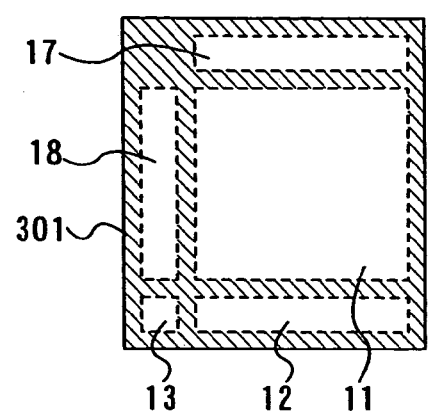
FIG. 6A  FIG. 6B
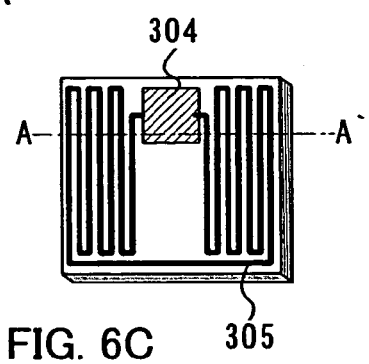 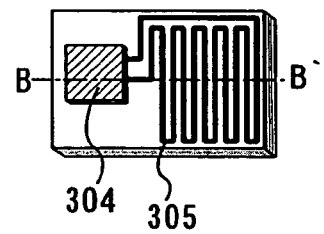
FIG. 6C  FIG. 6D
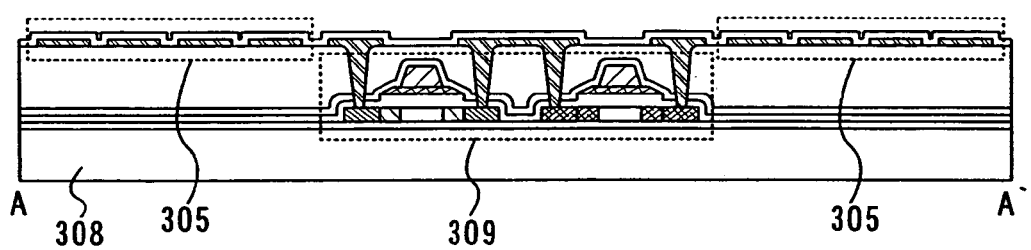
FIG. 6E
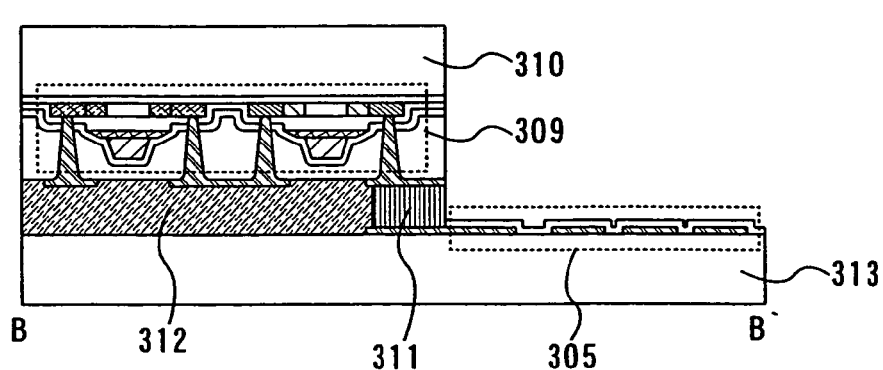
FIG. 6F

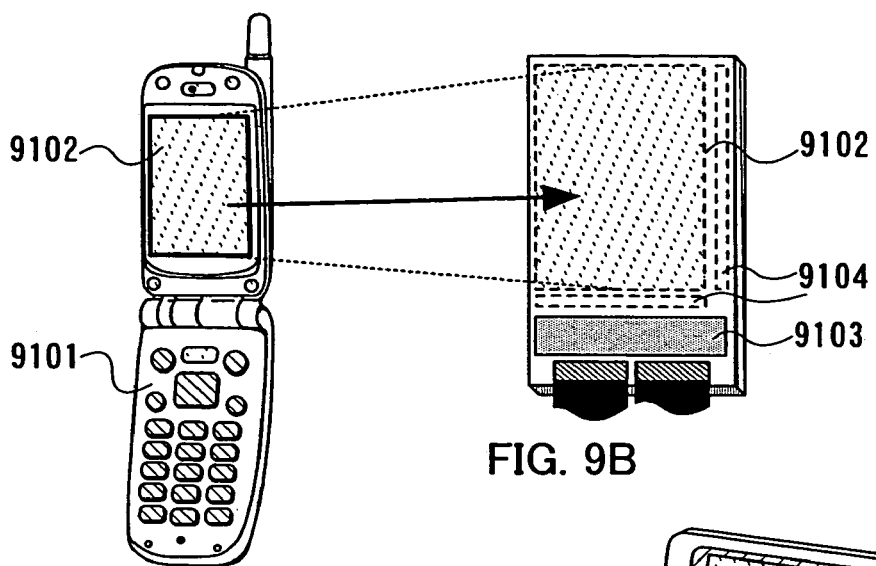
FIG. 9A
FIG. 9B
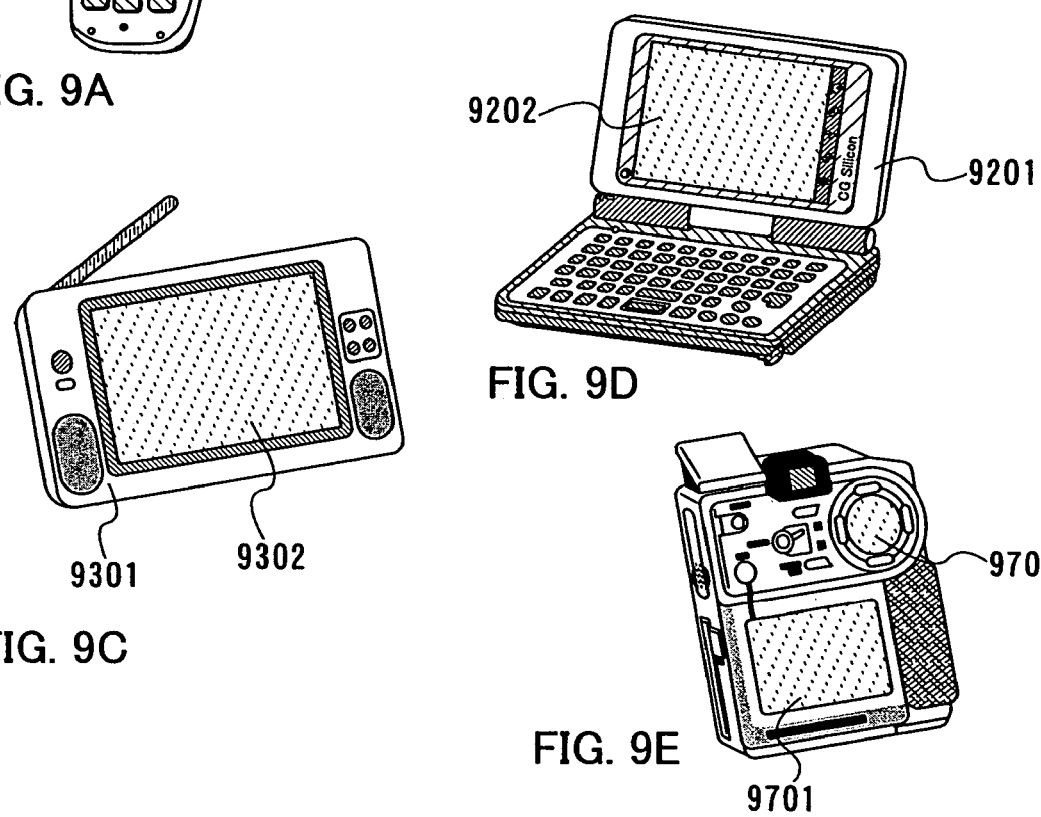
FIG. 9C
FIG. 9D
FIG. 9E
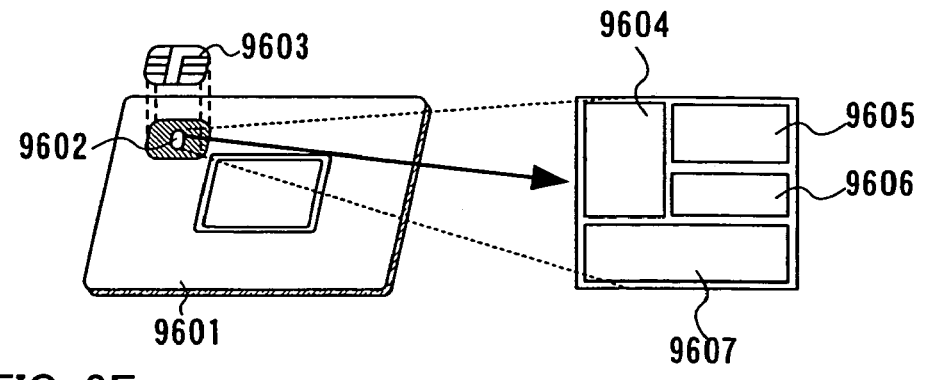
FIG. 9F

SEMICONDUCTOR DEVICE

BACKGROUND OF THE INVENTION

1. Field of the Invention

The present invention relates to a semiconductor device having a semiconductor element. In addition, the invention relates to a semiconductor device (hereinafter, referred to as "ID tag") in which data communication is possible by wireless communication.

2. Description of the Related Art

In recent years, a semiconductor device having a semiconductor element has been applied to various fields such as an IC card as well as electronic appliances such as a computer, a portable terminal, and the like and is promoted to have a high capacity. A semiconductor device has a memory cell array which comprises a plurality of memory cells each including a memory element in a region where a bit line and a word line intersect through an insulator, and a precharge circuit for setting potential of the bit line to arbitrary potential in a non-selected state of the word line.

As the capacity of a semiconductor device has been increased, delay in a selection of address has been caused by resistance of a wiring which is made longer or by the complexity of a large-scaled decoder. Then it generates a selected state of a word line when a precharge operation of a bit line is performed. Accordingly, data in a memory cell may be rewrited or destroyed by causing malfunction. In other words, reading and writing of data cannot be performed accurately.

BRIEF SUMMARY OF THE INVENTION

In view of the above conventional problem, it is an object of the invention to provide a semiconductor device, an ID tag, in which reading and writing of data can be performed accurately by preventing malfunction, even when a selection of address delays.

The invention provides a semiconductor device, an ID tag, having a following structure in order to solve the problems of conventional technologies described above.

One feature of a semiconductor device according to the invention is that three factors of a data holding unit, a precharge unit and a delay unit are included. The data holding unit comprises a plurality of memory cells. The precharge unit comprises a precharge potential line, a precharge signal line and a plurality of switches. The delay unit comprises a plurality of transistors. Further, another feature is that it has one or both of an address selecting unit, having a column-decoder and a row-decoder, and a display unit having a plurality of pixels, in addition to the above three factors.

Each of the plurality of memory cells in the data holding unit includes a memory element in a region where a bit line and a word line intersect through an insulator. The memory element is one or more selected among a transistor, a capacitor element and a resistor element.

The precharge potential line in the precharge unit is a wiring for transmitting precharge potential, and the precharge signal line is a wiring for transmitting a precharge signal. In addition, each of the plurality of switches is disposed between the precharge potential line and the bit line. Each of the plurality of switches is an element having a switching function, and is a transistor or an analog switch in many cases. Additionally, an input node of the plurality of switches is connected to the precharge signal line. Note that when each of the plurality of switches is a transistor, an input node of the plurality of switches corresponds to a gate electrode of a transistor. Further, when each of the plurality of switches is an analog switch, input nodes of the plurality of switches correspond to a gate electrode of an n-type transistor and a gate electrode of a p-type transistor constituting the analog switch.

Input nodes of the delay unit are connected to a CK line and a WEB line; a CK line, a WEB line and a CEB line; an REB line and a WEB line; or an REB line, a WEB line and a CEB line. Further, an output node of the delay unit is connected to the precharge signal line. In addition, the delay unit comprises a plurality of transistors, and the plurality of transistors constitutes a plurality of logic circuits. Thus, the input nodes of the delay unit correspond to input nodes of the logic circuit constituted at the extremity among the circuits.

An ID tag of the invention has a memory unit including three factors of a data holding unit, a precharge unit and a delay unit; a control unit; a power generation unit; and a transmit and receive unit. In addition, an ID tag of the invention has a memory unit including four factors of a data holding unit, a precharge unit, a delay unit and an address selecting unit; a control unit; a power generation unit; and a transmit and receive unit.

A semiconductor device in which malfunction can be prevented and reading and writing of data can be accurately performed can be provided, according to the invention having a data holding unit, a precharge unit and a delay unit. In addition, a semiconductor device in which a high function and a high added value are realized can be provided, according to the invention having a display unit as well as the data holding unit, the precharge unit and the delay unit.

BRIEF DESCRIPTION OF THE DRAWINGS

FIGS. 6A to 6F are diagrams illustrating Embodiment Mode 3 according to the invention.

FIGS. 9A to 9F are diagrams illustrating Embodiment 2 according to the invention.

DETAILED DESCRIPTION OF THE INVENTION

Figure 1:
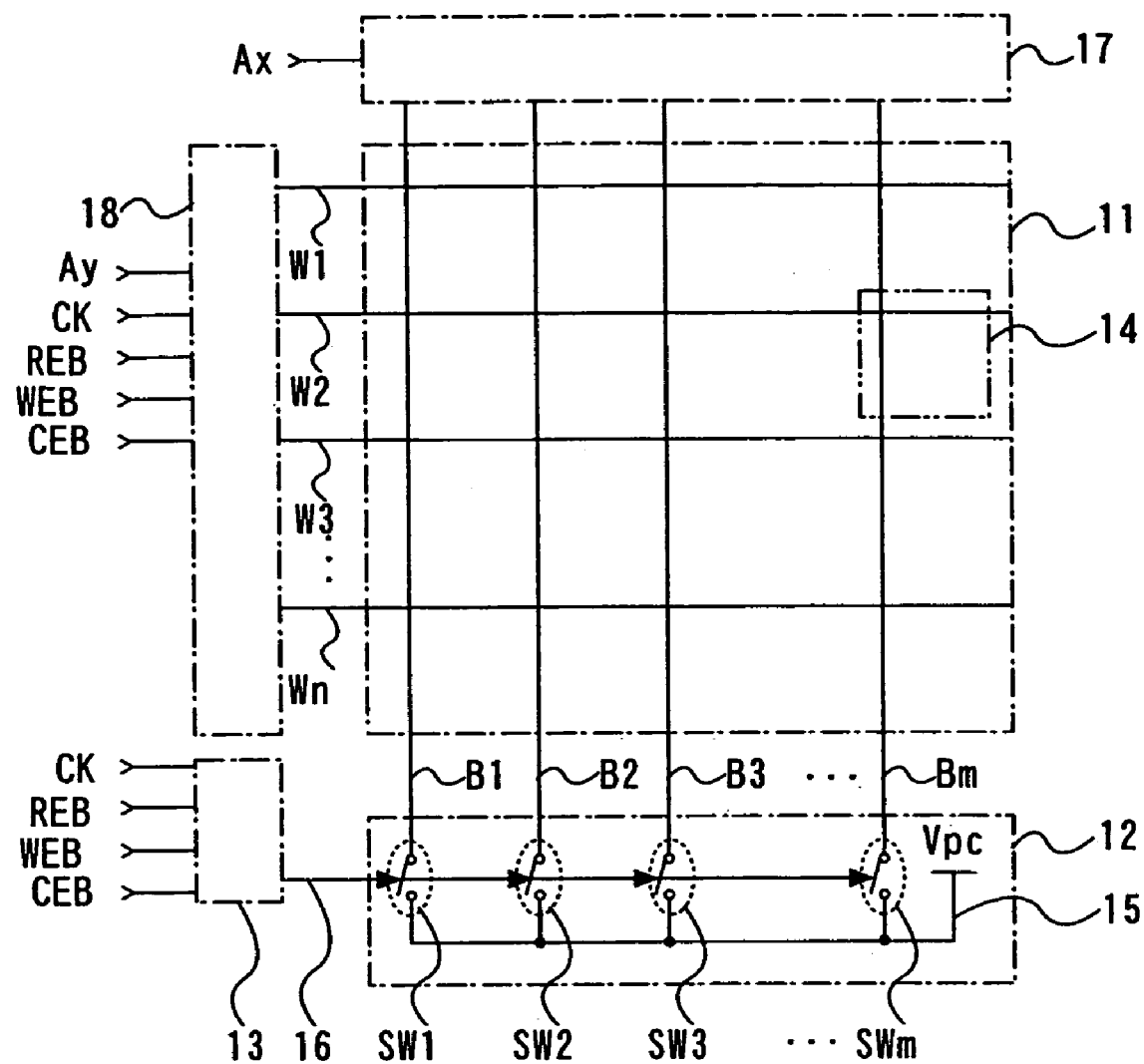
FIG. 1 is a diagram illustrating Embodiment Mode 1 according to the invention.

Hereinafter, embodiment modes of the invention are described in detail with reference to the drawings. However, the invention should not be limited to the following description, and it is easily understood by those skilled in the art that the mode and the detail of the invention can be variously changed without departing from the purpose and the scope of the invention. Therefore, the invention can be construed without the limitation of the description of the embodiment modes. Note that reference numerals denoting the same things are used in common among different drawings in a structure of the invention explained below.

EMBODIMENT MODE 1

A semiconductor device of the invention includes three basic factors of a data holding unit 11 (hereinafter referred to as a memory cell array 11), a precharge unit 12 and a delay unit 13 (cf. FIG. 1). The semiconductor device of the invention corresponds to a memory unit having a function to store data, and the memory unit includes the three basic factors of the data holding unit 11, the precharge unit 12 and the delay unit 13.

The memory cell array 11 comprises a plurality of memory cells 14 arranged in a matrix (cf. FIG. 1). Further, the memory cell array 11 comprises bit lines, B1 to Bn (n is a natural number), from the first line to the n-th line in columns and word lines, W1 to Wm (m is a natural number), from the first line to the m-th line in rows. The memory cells 14 each include a memory element in a region where a bit line Bx ($1 \leq x \leq n$) and a word line Wy ($1 \leq y \leq m$) intersect through an insulator.

The memory element is one or more selected among a transistor, a capacitor element, and a resistor element. When a semiconductor device of the invention is a DRAM (Dynamic Random Access Memory), one transistor and one capacitor element are used as a memory element. When the semiconductor device is an SRAM (Static Random Access Memory), six transistors; five transistors; four transistors and two resistor elements; or four transistors and one resistor element are used. Note that when six transistors, or four transistors and two resistor elements are used as a memory element, two bit lines (one of them is a bit line and another is a bit bar line) are arranged at each column. Note that the semiconductor device of the invention is not limited to a DRAM or an SRAM. Alternately an FRAM (Ferroelectric Random Access Memory), a masked Rom (Read Only Memory), a PROM (Programmable Read Only Memory), an EPROM (Electrically Programmable Read Only Memory), an EEPROM (Electrically Erasable Read Only Memory), a flash memory, or the like may be adopted depending on a configuration of a memory element.

The precharge unit 12 (also referred to as a precharge circuit) comprises a precharge potential line 15, a precharge signal line 16 and a plurality of switches SW1 to SWm (m is a natural number) (cf. FIG. 1). The plurality of switches SWx ($1 \leq x \leq m$) are disposed between the precharge potential line 15 and the bit line Bx. In addition, the plurality of switches SWx is an element having a switching function and, for example, it is a transistor or an analog switch. Further, an input node of the plurality of switches SWx is connected to the precharge signal line 16. In other words, conduction or non-conduction of the switch SWx is controlled by a precharge signal transmitted from the precharge signal line 16.

Figures 2A, 2B:
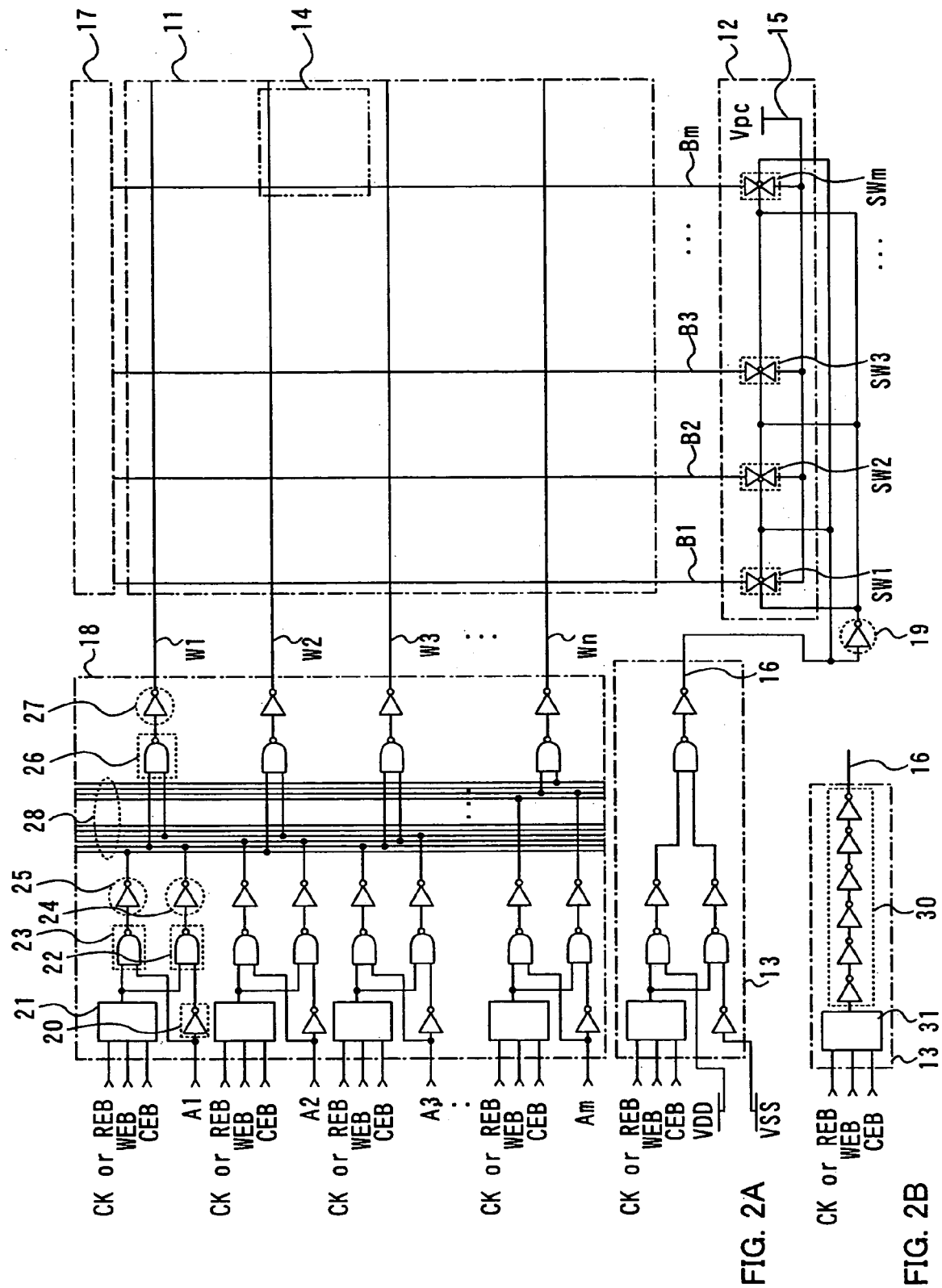
FIGS. 2A and 2B are diagrams illustrating Embodiment Mode 1 according to the invention.

In this embodiment mode, a mode in which an analog switch is used as a switch SWx is shown (cf. FIG. 2A). Input nodes of an analog switch correspond to a gate electrode of an N-type transistor and a gate electrode of a P-type transistor constituting an analog switch. In other words, gate electrodes of both the transistors are connected to the precharge signal line 16 electrically. Specifically, the gate electrode of the P-type transistor constituting an analog switch is connected to the precharge signal line 16 directly, and the gate electrode of the N-type transistor is connected to an output node of an inverter 19. An input node of the inverter 19 is connected to the precharge signal line 16.

The delay unit 13 (also referred to as a delay circuit) has a plurality of transistors (cf. FIGS. 1 and 2). Specifically, the delay unit 13 comprises a plurality of logic circuits constituted of a plurality of transistors, and the plurality of transistors constitutes at least one inverter. More specifically, the delay unit 13 comprises a plurality of logic circuits selected among an AND circuit, a NAND circuit, a OR circuit, a NOR circuit, an EOR circuit, an ENOR circuit, a TriBUF (tri-state buffer) circuit and a TriINV (tri-state inverter) circuit and a plurality of inverters, or it comprises a plurality of inverters serially-connected.

Thus, FIG. 2A shows a case that the delay unit 13 has logic circuits and inverters, and FIG. 2B shows a case that the delay unit 13 has only inverters.

In a mode shown in FIG. 2A of the former, input nodes of the delay unit 13 correspond to input nodes of a logic circuit 21, and an output node of the delay unit 13 corresponds to an output node of an inverter 27. Note that a decoder shown in FIG. 2A comprises an inverter 20, logic circuits 21 to 23, inverters 24 and 25, a logic circuit 26, the inverter 27 and a wiring 28. However, various configurations can be applied to the structure of the decoder, without being limited to the above description.

Note that in a mode shown in FIG. 2B of the latter, the delay unit 13 comprises an inverter group 30 and a logic circuit 31. Input nodes of the delay unit 13 correspond to input nodes of the logic circuit 31, and an output node of the delay unit 13 corresponds to an output node of the inverter group 30.

The input nodes of the delay unit 13 are connected to a CK line and a WEB line; a CK line, a WEB line and a CEB line; an REB line and a WEB line; or an REB line, a WEB line and a CEB line. The output node thereof is connected to the precharge signal line 16. Connection of the input nodes depends on a relation to timing of a precharge operation and CK, and whether a CEB signal is required or not. More specifically, when the precharge operation is performed in synchronism with CK, the input nodes of the delay unit 13 are connected to a CK line and a WEB line; or a CK line, a WEB line and a CEB line. On the other hand, when the precharge operation is performed in asynchronism with CK, the input nodes of the delay unit 13 are connected to an REB line and a WEB line; or an REB line, a WEB line and a CEB line.

A CEB signal is unnecessary when only one chip is disposed or when an operation of reading or writing is always performed though a plurality of chips are disposed.

Note that a CK line is a wiring for transmitting a CK (clock) signal, a WEB (write-enable) line is a wiring for transmitting a WEB signal, an REB (read-enable) line is a wiring for transmitting an REB signal, a CEB (chip-enable) line is a wiring for transmitting a CEB signal. In addition, a WEB signal is a writing control signal, an REB signal is a reading control signal, and a CEB signal is a chip selection signal.

In the invention having the delay unit 13, output of a precharge signal, which controls conduction or non-conduction of the switch SWx comprised in the precharge unit 12, can be delayed. Therefore, even when switching from a selected state to a non-selected state of a word line Wy is delayed, a precharge operation is prevented while the word line Wy is selected, because output of a precharge signal delays, too. Thus, in a semiconductor device of the invention having the above-described structure, malfunction is prevented, and reading and writing of data can be performed accurately.

One feature of the invention is that an address selecting unit is included as well as three basic factors of the data holding unit 11, the precharge unit 12 and the delay unit 13 (cf. FIGS. 1 and 2).

The address selecting unit has a column-decoder 17 and a row-decoder 18, and selects one memory cell among the plurality of memory cells 14. The column-decoder 17 is connected to bit lines B1 to Bm, and the row-decoder 18 is connected to word lines W1 to Wn. In addition, the column-decoder 17 is connected to a column address selecting line, and the row-decoder 18 is connected to a row address selecting line. Note that the column address selecting line is a wiring for transmitting a column address selection signal (Ax, $1 \leq x \leq m$), and the row address selecting line is a wiring for transmitting a row address selection signal (Ay, $1 \leq y \leq n$). Further, the row-decoder 18 is connected to a plurality of wirings among a CK line, an REB line, a WEB line and a CEB line. The wiring connected to the row-decoder 18 depends on a relation to timing of a precharge operation and CK, and whether a CEB signal is required or not, as the connection of the input nodes of the delay unit 13.

In this embodiment mode, the row address selecting line Ay is connected to the input nodes of the inverter 20. The plurality of wirings selected among a CK line, an REB line, a WEB line and a CEB line are connected to input nodes of the logic circuit 21. An output node of the inverter 27 is connected to a word line Wy.

In the invention, a display unit (not shown in FIGS. 1 and 2) having a plurality of pixels may be comprised, in addition to the three basic factors of the data holding unit 11, the precharge unit 12 and the delay unit 13 described above. A semiconductor device in which a high function and a high added value are realized, can be provided by having a display unit.

Additionally, although not illustrated, a required circuit such as a sense amplifier used when binary data is determined, a read/write circuit for controlling whether reading is operated or writing is, or an output circuit for outputting data outside may comprise appropriately, in the invention.

Figure 3A:
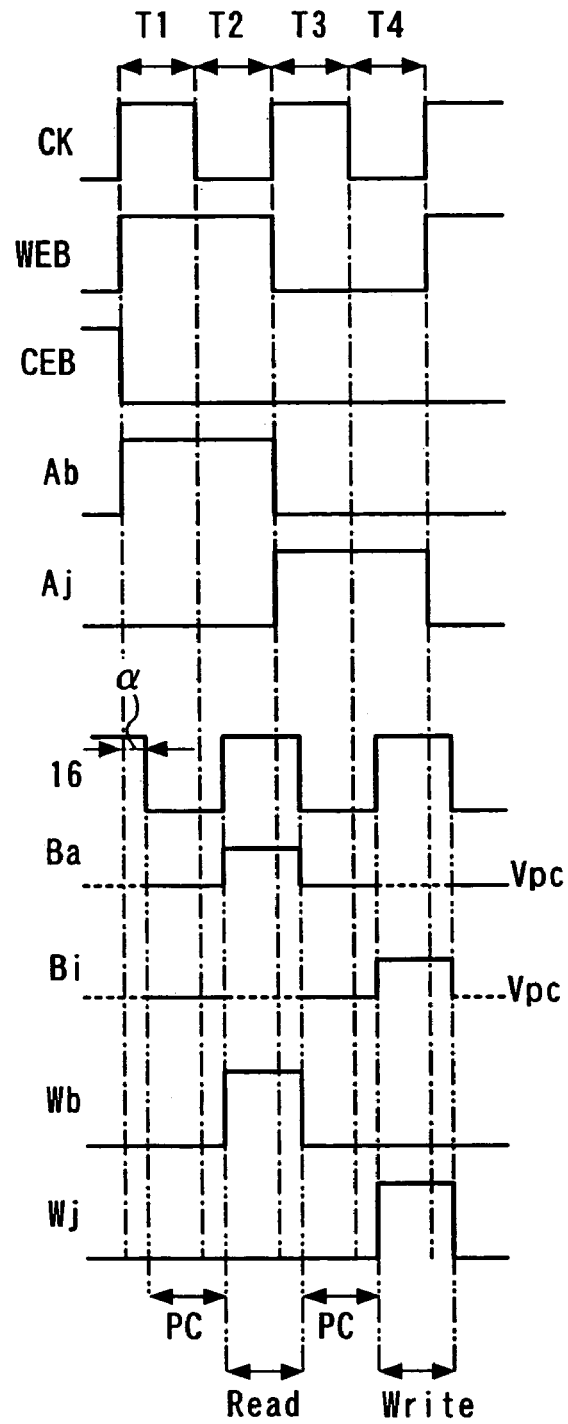
FIGS. 3A and 3B are diagrams illustrating Embodiment Mode 1 according to the invention.
Figure 3B:
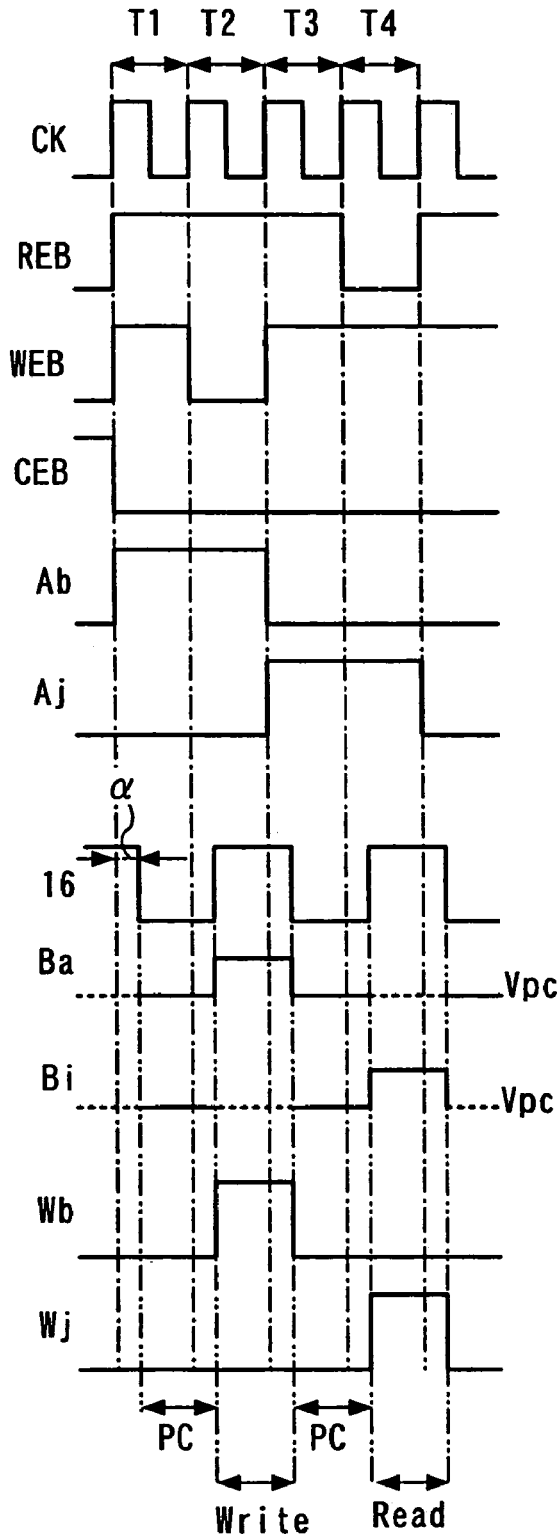

An operation of a semiconductor device having the above configuration is explained by using timing charts of FIGS. 3A and 3B.

First, FIG. 3A explains a case of a precharge operation in synchronism with CK Here, a mode such that a precharge operation is performed when CK is H level and WEB is H level, or CK is H level and WEB is L level, a reading operation is performed when CK is L level and WEB is H level, and a writing operation is performed when CK is L level and WEB is L level, is explained.

Note that dotted lines wave-formed showing a potential of wirings in timing charts of FIGS. 3A and 3B show a suspension state (may be referred to as an undefined state or a floating state). In addition, CEB is constantly H level or L level in some operations without depending upon control of an operation, and here, CEB is always set to L level.

In a period T1, CK is H level, WEB is H level, CEB is L level, and an address selection signal Ab for selecting an address of b-th row ($1 \leq b \leq n$, b is a natural number) is H level. After a delay period α passes in the period T1, a precharge signal of L level is transmitted to the precharge signal line 16 from the delay unit 13, and thus the precharge signal line 16 has the same potential as a signal of L level. Then, all analog switches SW1 to SWm where a signal of H level or L level is input through the precharge signal line 16 become conductive, and all bit lines B1 to Bm are precharged to precharge potential Vpc.

In a period T2, CK is L level, WEB is H level, CEB is L level and Ab is H level. After a delay period a passes in the period T2, the column-decoder 17 selects a bit line Ba of a-th column ($1 \leq a \leq m$, a is a natural number). Simultaneously, a signal of H level is transmitted to a word line Wb of b-th row and the word line Wb becomes a selected state. Then, data of H level is read by a bit line Ba is performed from the memory cell 14 arranged at a coordinate (a, b).

In a period T3, CK is H level, WEB is L level, CEB is L level, and an address selection signal Aj for selecting an address of j-th row ($1 \leq j \leq n$, j is a natural number) is H level. After a delay period α passes in the period T3, a precharge signal of L level is transmitted to the precharge signal line 16, all analog switches SW1 to SWm become conductive, and all bit lines B1 to Bm are precharged to precharge potential Vpc.

In a period T4, CK is L level, WEB is L level, CEB is L level and Aj is H level. After a delay period a passes in the period 4, the column-decoder 17 makes a bit line Bi of i-th column ($1 \leq i \leq m$, i is a natural number) a selected state, and a signal of H level is transmitted. Simultaneously, the signal of H level is transmitted to a word line Wj of j-th row, and the word line Wj becomes a selected state. Then data of H level is written in the memory cell 14 arranged at a coordinate (i, j).

Subsequently, a mode of a precharge operation in asynchronism with CK is explained by using FIG. 3B. In this case, a precharge operation is performed when REB is H level and WEB is H level, a writing operation is performed when REB is H level and WEB is L level, and a reading operation is performed when REB is L level and WEB is H level. In addition, CEB is always set to L level.

In a period T1, REB is H level, WEB is H level and Ab is H level. After a delay period α passes in the period T1, a precharge signal of L level is transmitted to the precharge signal line 16, all analog switches SW1 to SWm become conductive, and all bit lines B1 to Bm are precharged to precharge potential Vpc.

In a period T2, REB is H level, WEB is L level and Ab is H level. After a delay period α passes in the period T2, a bit line Ba and a word line Wb become a selected state. Then, data of H level is written by a bit line Ba into the memory cell 14 arranged at a coordinate (a, b).

In a period T3, REB is. H level, WEB is H level and Aj is H level. After a delay period α passes in the period T3, a precharge signal of L level is transmitted to the precharge signal line 16, all analog switches SW1 to SWm become conductive, and all bit lines B1 to Bm are precharged to precharge potential Vpc.

In a period T4, REB is L level, WEB is H level and Aj is H level. After a delay period α passes in the period T4, a bit line Bi and a word line Wj become a selected state. Then, data of H level of a bit line Bi is read from the memory cell 14 arranged at a coordinate (i, j).

In this way, in each of the precharge periods T1 and T3, the writing period T2 and the reading period T4, a precharge operation, a writing operation and a reading operation are respectively performed by operating as above.

In the invention having the above configuration, output of a precharge signal, which controls conduction or non-conduction of the switch SWx, can be delayed. Therefore, even if switching from a selected state to a non-selected state of a word line Wy is delayed, a precharge operation is not performed while the word line Wy is selected because output of a precharge signal delays, too. Thus, in the invention having the structure, malfunction is prevented, and reading and writing of data can be performed accurately.

EMBODIMENT MODE 2

Figure 4A:
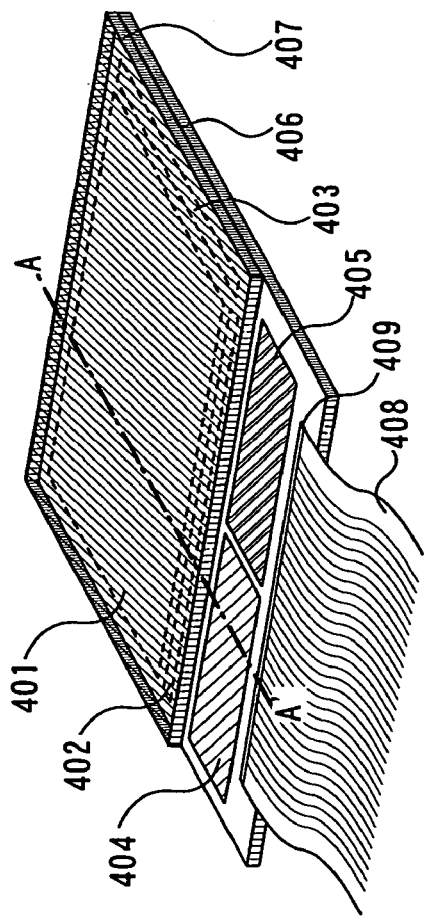
FIGS. 4A and 4B are diagrams illustrating Embodiment Mode 2 according to the invention.

A panel which is one mode of a semiconductor device according to the invention is described by using the drawings. The panel comprises a pixel portion 401 having a plurality of pixels and driver circuits 402 and 403 each including a plurality of transistors over a substrate 406 (cf. FIG. 4A). The driver circuits 402 and 403 may be attached externally or may be mounted on the substrate 406 by a COG (Chip On Glass) or the like, without being formed integrally on the substrate 406. Thus, a display unit corresponds to only the pixel portion 401, or the pixel portion 401 and the driver circuits 402 and 403. In addition, the panel comprises a memory unit 404 corresponding to a VRAM (memory dedicated to a screen display), a RAM or a ROM and a CPU (Central Processing Unit) 405 over the substrate 406. Further, the panel comprises an input terminal 409 for supplying a signal controlling the driver circuits 402 and 403, the memory unit 404 and the CPU 405 over the substrate 406. The input terminal 409 is supplied with a signal such as a video signal or a potential through a connection film 408. In addition, the panel comprises sealing member (not shown in FIG. 4A) surrounding the pixel portion 401 and the driver circuits 402 and 403, and an opposing substrate 407 is stuck with the substrate 406 by the sealing member. Note that the opposing substrate 407 is disposed only over the pixel portion 401 and the driver circuits 402 and 403 in the panel illustrated, but it may be disposed over the entire surface. In addition, a cooling wheel is preferably formed so as to contact with the CPU 405 because the CPU 405 has a risk of generating heat.

Figure 4B:
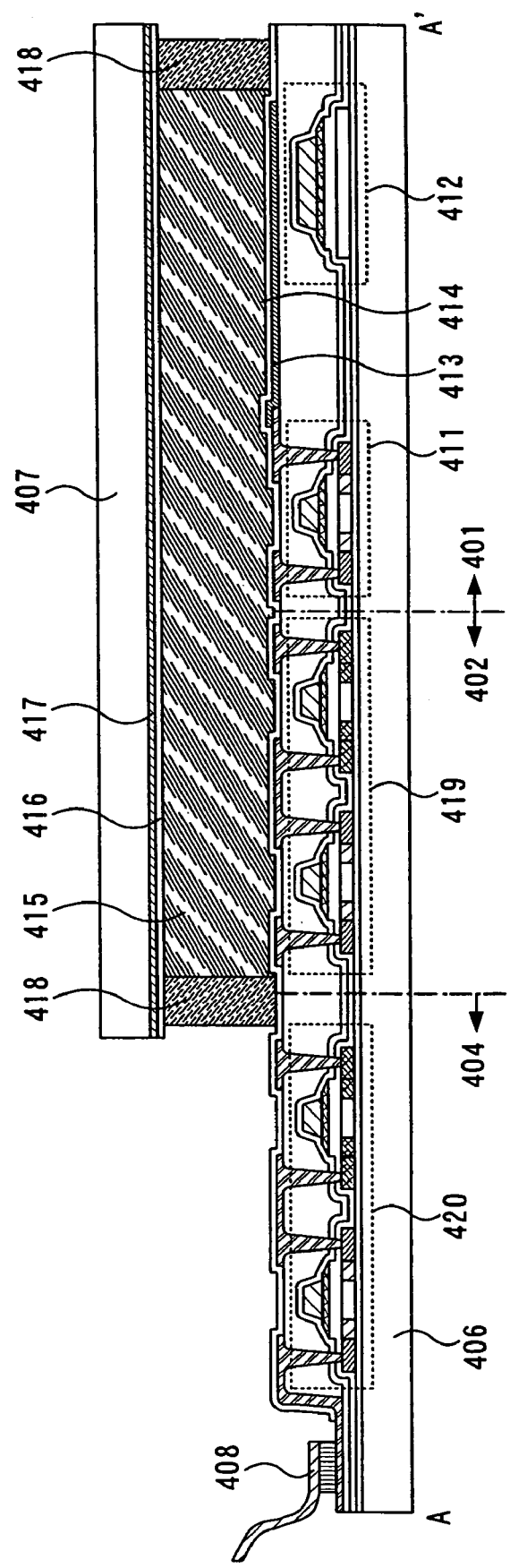

FIG. 4B shows a cross-sectional view along a line A–A' of the panel. The pixel portion 401 comprises a TFT 411 and a capacitor element 412; the driver circuit 402 has an element array 419 comprising TFFs; and the memory unit 404 has an element array 420 comprising TFTs. Between the substrate 406 and the opposing substrate 407, a pixel electrode 413, an orientation film 414, a liquid crystal layer 415, an orientation film 416 and a counter electrode 417 are comprised. A polarizing plate is stuck on each of the substrate 406 and the opposing substrate 407.

An element which constitutes a circuit over the substrate 406 is preferably formed of a polycrystalline semiconductor (poly-silicon) which is superior in a property such as mobility in comparison with an amorphous semiconductor, and then a monolithic panel is realized. In this way, a panel which a functional circuit such as a memory unit and a CPU are formed integrally in addition to a pixel portion and a driver circuit, is referred to as a system on a panel, and it can implement a multifunctional system. A panel having the above structure can realize downsizing, lightweight and thinness because the number of connected external ICs decreases, and it is quite effective to apply the panel to a potable terminal which has came into wide use recently. Note that in this mode, a panel using a liquid crystal element as a display element is shown, but the invention is not limited to this. It may be applied to a panel using other display elements such as a light-emitting element as a display element.

Figure 5:
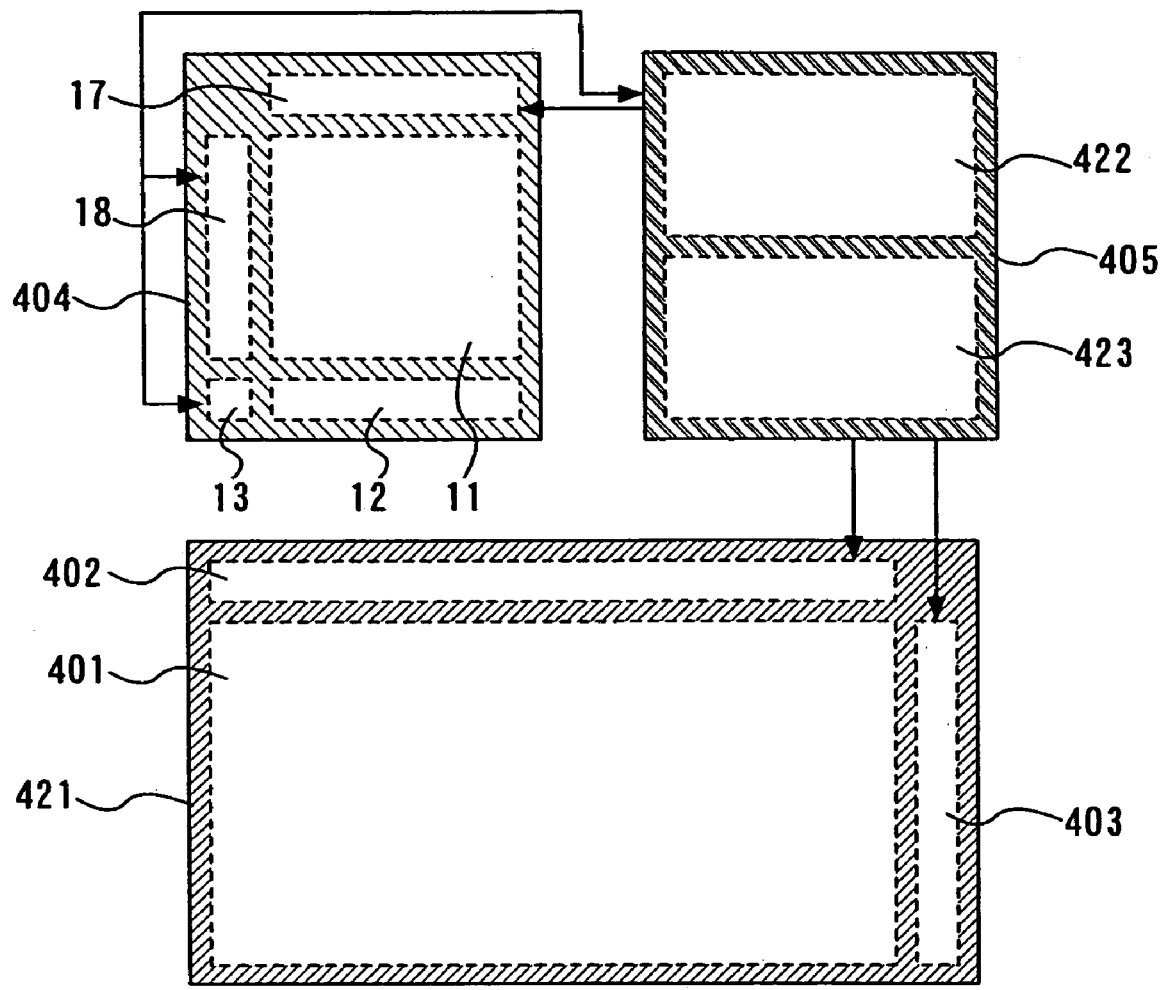
FIG. 5 is a diagram illustrating Embodiment Mode 2 according to the invention.

In the above panel, the structure of the semiconductor device explained in Embodiment Mode 1 is applied to a structure of the memory unit 404. In other words, a feature of the memory-unit 404 is to have the data holding unit 11, the precharge unit 12 and the delay unit 13. In addition, it also has an address selecting unit having the column-decoder 17 and the row-decoder 18 as other feature (cf. FIG. 5). Accordingly, the panel of the invention contributes to prevent malfunction and to perform reading and writing accurately.

Next, interrelation among a display unit 421 including the pixel portion 401 and the driver circuits 402 and 403, the memory unit 404 and the CPU 405 and the serial operation thereof are briefly described as follows.

The CPU 405 includes a control section 422 and an arithmetic section 423.

First, information of an address of a memory cell in which data is stored or a memory cell to store data is supplied for the row-decoder 18 which is an address selecting unit and the delay unit 13 included in the memory unit 404 from the program counter in the control section 422 of the CPU 405, when reading or writing of data is conducted from the memory unit 404.

Information read from a specified address is supplied for a control register in the control section 422, from the column-decoder 17. In addition, information to be written in a specified address is supplied from a register in the arithmetic section 423.

An image in the pixel portion 401 included in the display unit 421 is displayed according to a signal supplied for the driver circuits 402 and 403 from the CPU 405. Note that when a video signal is stored in the memory unit 404, it is supplied for the driver circuit 402 of the signal line side from the memory unit 404 through the CPU 405.

This embodiment mode can be freely combined with the embodiment mode described above.

EMBODIMENT MODE 3

A structure of an ID tag (also referred to as an RFID tag, an IC tag, an electronic tag, an IC chip, a radio chip, a radio processor, and a radio memory) according to the invention is explained. An ID tag 306 of the invention comprises an IC chip 304 including a memory unit 301, a control unit 302 and a power generation unit 303, and an antenna 305 (also referred to as a transmit and receive unit) (cf. FIG. 6A).

In the panel, the structure of the semiconductor device described in Embodiment Mode 1 is applied to a structure of the memory unit 301. In other words, one feature is that the memory unit 301 has the data holding unit 11, the precharge unit 12 and the delay unit 13. In addition, another feature is that it comprises an address selecting unit having the column-decoder 17 and the row-decoder 18 (cf. FIG. 6B). Accordingly, the ID tag of the invention contributes to prevent malfunction and perform reading and writing accurately. Note that the memory unit 301 can be a RAM, a ROM or the like according to a structure of a memory element in a data holding unit, but a ROM is preferably adopted as the memory unit 301 employed for an ID tag.

The control unit 302 is configured with a logic circuit. The control unit 302 (also referred to as a control circuit) corresponds to a CPU (Central Processing Unit). In the case of a non-contact type, electromagnetic induction or mutual induction of an antenna 305 wound up in the shape of coil, or induction by static electricity is adopted as the power generation unit 303. Thus, in this case, the power generation unit 303 (also referred to as a power generation circuit) operates in conjunction with the antenna 305. The antenna 305 can select height of frequency to receive by controlling the number of windings.

As for the antenna 305, a method for forming the antenna 305 on the same substrate as the IC chip 304 (cf. FIGS. 6C and 6E), or a method for mounting the IC chip 304 on a substrate 313 including the antenna 305 (cf. FIGS. 6D and 6F) is adopted. When the former method is adopted, a group of TFFs 309 and the antenna 305 are disposed over a substrate 308 (cf. FIG. 6E). On the other hand, when the latter method is adopted, a substrate 310 including the group of TFFs 309 is mounted over the substrate 313 including the antenna 305 with a conductive layer 311 and an insulating layer 312 interposed therebetween (cf. FIG. 6F). Note that the group of TFTs 309 shown in FIGS. 6E and 6F is a constituent of one of the memory unit 301, the control unit 302 and the power generation unit 303.

Next, a communication procedure with the ID tag 306 is briefly explained hereinafter (cf. FIG. 6A). First, the antenna 305 included in the ID tag 306 receives a radio wave from a reader-writer 307. Then, electromotive force occurs by resonance action in the power generation unit 303. The memory unit 301 and the control unit 302 included in the ID tag 306 are activated, and data in the memory unit 301 is transformed into a signal by the control unit 302. Next, a signal is sent from the antenna 305 in the ID tag 306. Then the ID tag 306 receives a signal transmitted by the antenna in the reader-writer 307. The received signal is transmitted to a data processing system (not shown in FIG. 6A) through a controller (not shown in FIG. 6A) in the reader-writer 307, and data processing is performed by using software. In the above communication procedure, a coiled antenna is used and an electromagnetic induction method using magnetic flux generated by induction between a coil of an ID tag and a coil of a reader-writer is adopted. However, the invention is not limited to the above methods, a radio wave method using a radio wave of a microwave band may be adopted.

The ID tag 306 has advantages that non-contact communication is possible; complement reading is possible; data writing is possible; transformation into various shapes is possible; directivity is wide and a wide recognition range is provided depending on the selected frequency; and the like. The ID tag 306, in non-contact radio communication, can be applied to an IC tag which can identify individual information of a person or a thing, an adhesive label which is enabled to be attached to an object by label processing, a wristband for an event or an amusement, or the like. In addition, the ID tag 306 may be processed with a resin material and it may be directly fixed to a metal obstructing radio communication. Further, the ID tag 306 can be utilized for an operation of a system such as an entering-leaving management system or a checkout system.

Figure 7A:
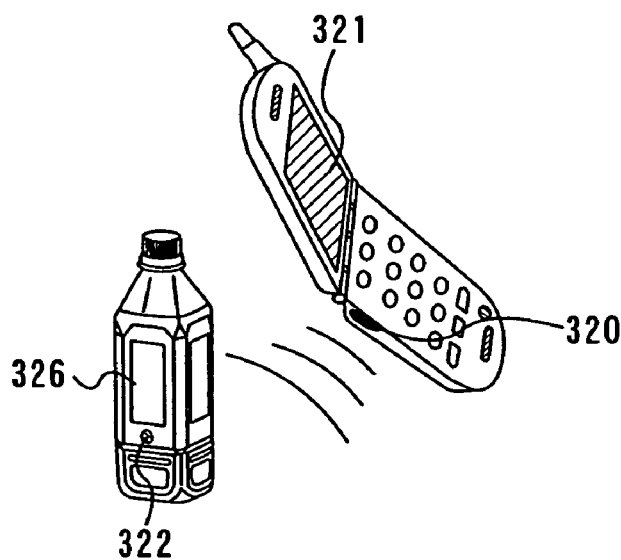
FIGS. 7A and 7B are diagrams illustrating Embodiment Mode 3 according to the invention.
Figure 7B:
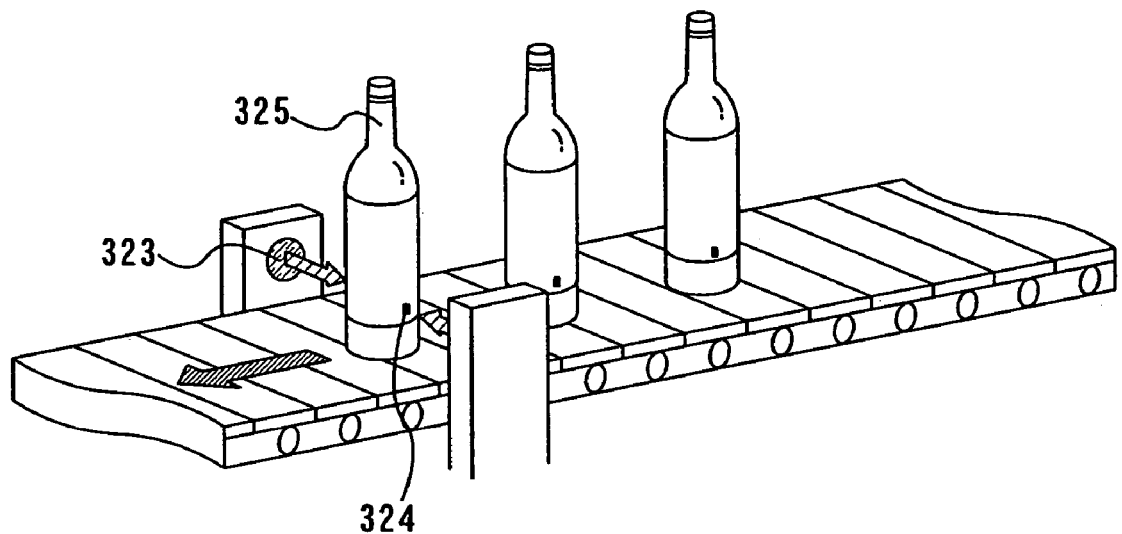

Next, one mode of the actual use of the ID tag 306 practically is explained. A reader-writer 320 is disposed in a side of a portable terminal including a display portion 321, and an ID tag 322 is disposed in a side of merchandise 326 (cf. FIG. 7A). When the reader-writer 320 is held against the ID tag 322, information relating to merchandise, such as a raw material and a place of origin of the merchandise, a test result per production process, a record of distribution process, or further, description of the merchandise is displayed in the display portion 321. In addition, merchandise 325 can be inspected by using a reader-writer 323 and an ID tag 324 disposed in the merchandise 325, when the merchandise 325 is transported with a belt conveyor (cf. FIG. 7B). In this manner, information can be easily obtained, and a high function and a high added value are realized by utilizing an ID tag for a system.

EMBODIMENT 1

Figure 8:
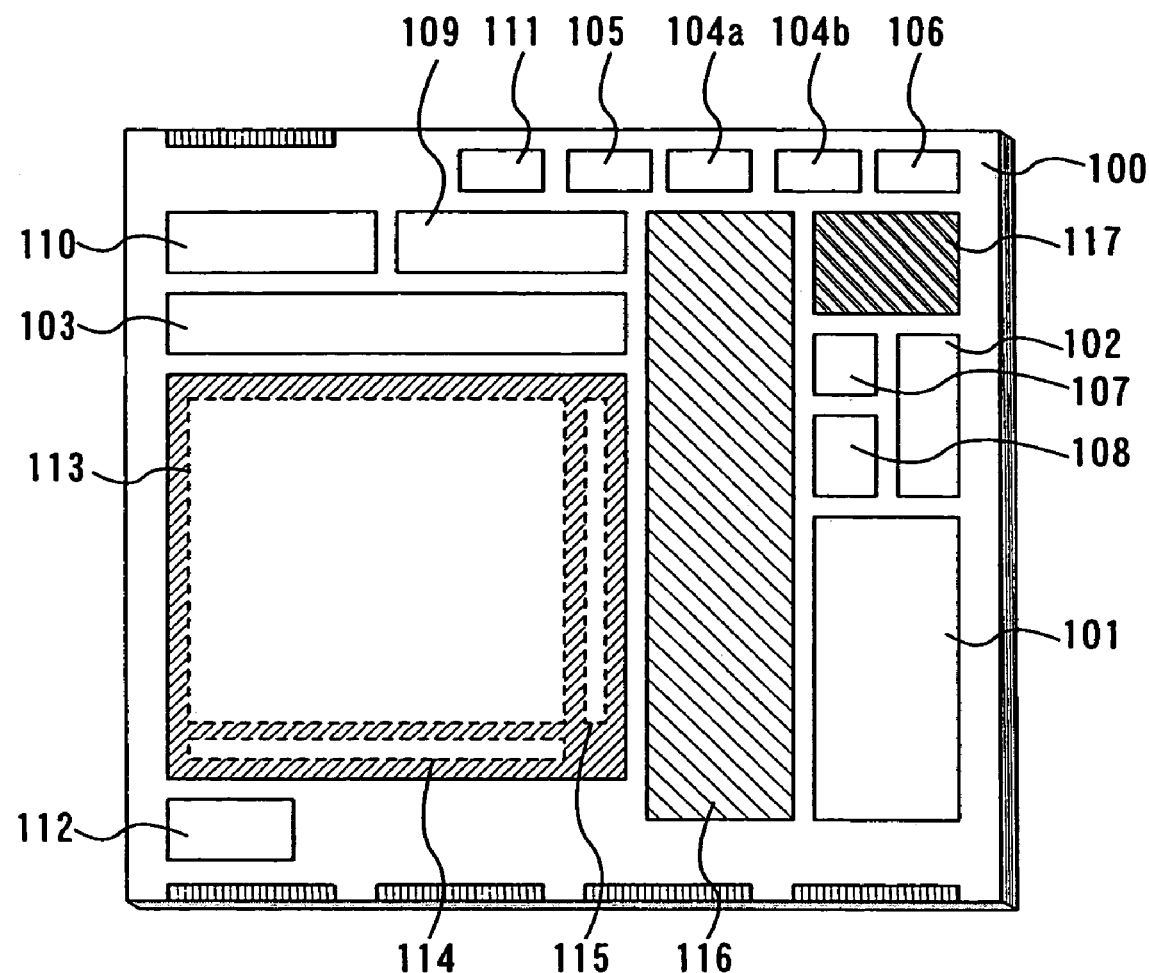
FIG. 8 is a diagram illustrating Embodiment 1 according to the invention.

An embodiment of the invention is explained with reference to FIG. 8. A semiconductor device of the invention comprises mainly four blocks of a data memory block, a display block, an image processing block and a control block, and all blocks are disposed on a substrate 100. The data memory block comprises a program ROM (PROM) 101, a working area RAM (WRAM) 102, an audio data program ROM (Audio ROM) 103, line buffers RAM 104$a$ and 104$b$, an in range RAM (IRAM) 105, a color pallet RAM (CRAM) 106, a memory controller 107, a decoder/register 108, an audio data program ROM controller 109, an audio data DA converter circuit/operational amplifier 110, a memory reference power generation circuit (Vref power supply) 111 and a gradation power supply 112. The display block comprises a pixel portion 113, and driver circuits 114 and 115. The image processing block comprises an image processing circuit 116. The control block comprises a CPU 117.

As described above, in a semiconductor device having not only a display block but also a data memory block, an image processing block and a control block, a number of ICs to be connected is reduced so that downsizing, thinness and lightweight can be realized. In addition, in a semiconductor device in which a display block, an image processing block and a control block are adjacently disposed, the arrangement is according to a data flow to realize an accurate operation. The invention is applied to the structure of each memory constituting a memory block. This embodiment can be combined with the above embodiment modes freely.

EMBODIMENT 2

As an example of electronic appliances to which the invention can be applied, a television device, a digital camera, a digital video camera, a portable telephone device (a portable telephone), a portable information terminal such as a PDA, a portable game machine, a monitor, a personal computer, a sound reproducing device such as a car audio, a video reproducing device comprising a recording medium such as a home game machine, or the like is given. Hereinafter, the specific examples are explained.

FIG. 9A shows a portable terminal which includes a main body 9101, a display portion 9102, or the like. FIG. 9C shows a portable TV receiver which includes a main body 9301, a display portion 9302, or the like. FIG. 9D shows a portable information terminal which N includes a main body 9201, a display portion 9202, or the like. FIG. 9E shows a digital video camera which includes display portions 9701, 9702, or the like.

A panel including a display portion comprises a driver circuit 9104, a functional circuit 9103 such as a CPU or a memory unit as shown in FIG. 9B. The invention is applied to the structure of the memory unit in the functional circuit 9103. An electronic appliance having a panel that is formed integrally with the functional circuit 9103 as well as with the driver circuit 9104 can has a reduced number of external ICs to be connected, thereby downsizing, lightweight and thinness can be realized. In addition, thinness, downsizing and light weight can be further advanced as compared with a case of using a liquid crystal element, because no back-light is required in adopting a self-luminous type light-emitting element as a display element for a display portion.

In addition, FIG. 9F shows a contact type IC card which includes a main body 9601, an IC chip 9602 and a module terminal 9603. The IC chip 9602 includes a RAM 9604, a ROM 9605, a CPU 9606, a RAM 9607, or the like. The invention is applied to the structure of a memory unit such as the RAMs 9604, 9607 and the ROM 9605 in the IC chip 9602. This embodiment can be combined with the above embodiment modes and the above embodiment freely.

What is claimed is:

1. A semiconductor device comprising:
a memory unit, comprising:
a data holding unit having a plurality of memory cells;
a precharge unit electrically connected to the data holding unit, having:
a precharge potential line;
a plurality of switches electrically connected to the precharge potential line; and
a precharge signal line electrically connected to the plurality of switches; and
a delay unit electrically connected to the precharge signal line, having a plurality of transistors;
a control unit electrically connected to the memory unit;
a power generation unit electrically connected to the memory unit and the control unit; and
a transmit and receive unit electrically connected to the control unit.

2. The semiconductor device according to claim 1, wherein each of the plurality of memory cells includes a memory element in a region where a bit line and a word line intersect each other through an insulator.

3. The semiconductor device according to claim 2, wherein the memory element is one or complement selected among a transistor, a capacitor element or a resistor element.

4. The semiconductor device according to claim 2, wherein the bit line is electrically connected to corresponding one of the plurality of switches.

5. The semiconductor device according to claim 1, wherein each of the plurality of switches is a transistor or an analog switch.

6. The semiconductor device according to claim 1, wherein input nodes of the delay unit are connected to a CK line and a WEB line; a CK line, a WEB line and a CEB line; an REB line and a WEB line; or an REB line, a WEB line and a CEB line.

7. The semiconductor device according to claim 1, wherein the semiconductor device is selected from the group consisting of a DRAM, an SRAM, an FRAM, a masked ROM, a PROM, an EPROM, an EEPROM and a flash memory.

8. A semiconductor device comprising:
a memory unit, comprising:
a data holding unit having a plurality of memory cells;
an address selecting unit electrically connected to the data holding unit, having a column-decoder and a row-decoder;
a precharge unit electrically connected to the data holding unit, having:
a precharge potential line;
a plurality of switches electrically connected to the precharge potential line; and
a precharge signal line electrically connected to the plurality of switches; and
a delay unit electrically connected to the precharge signal line, having a plurality of transistors;
a control unit electrically connected to the memory unit;
a power generation unit electrically connected to the memory unit and the control unit; and
a transmit and receive unit electrically connected to the control unit.

9. The semiconductor device according to claim 8, wherein each of the plurality of memory cells includes a memory element in a region where a bit line and a word line intersect each other through an insulator.

10. The semiconductor device according to claim 9, wherein the memory element is one or complement selected among a transistor, a capacitor element or a resistor element.

11. The semiconductor device according to claim 9, wherein the bit line is electrically connected to corresponding one of the plurality of switches.

12. The semiconductor device according to claim 8, wherein each of the plurality of switches is a transistor or an analog switch.

13. The semiconductor device according to claim 8, wherein input nodes of the delay unit are connected to a CK line and a WEB line; a CK line, a WEB line and a CEB line; an REB line and a WEB line; or an REB line, a WEB line and a CEB line.

14. The semiconductor device according to claim 8, wherein the semiconductor device is selected from the group consisting of a DRAM, an SRAM, an FRAM, a masked ROM, a PROM, an EPROM, an EEPROM and a flash memory.

15. A semiconductor device comprising:
a memory unit, comprising:
a data holding unit having a plurality of memory cells;
a precharge unit electrically connected to the data holding unit, having:
a precharge potential line;
a plurality of switches electrically connected to the precharge potential line; and
a precharge signal line electrically connected to the plurality of switches; and
a delay unit electrically connected to the precharge signal line, having a plurality of transistors;
a central processing unit electrically connected to the delay unit;
a display unit electrically connected to the central processing unit, having a plurality of pixels;
a control unit electrically connected to the memory unit;
a power generation unit electrically connected to the memory unit and the control unit; and
a transmit and receive unit electrically connected to the control unit.

16. The semiconductor device according to claim 15, wherein each of the plurality of memory cells includes a memory element in a region where a bit line and a word line intersect each other through an insulator.

17. The semiconductor device according to claim 16, wherein the memory element is one or complement selected among a transistor, a capacitor element or a resistor element.

18. The semiconductor device according to claim 16, wherein the bit line is electrically connected to corresponding one of the plurality of switches.

19. The semiconductor device according to claim 15, wherein each of the plurality of switches is a transistor or an analog switch.

20. The semiconductor device according to claim 15, wherein input nodes of the delay unit are connected to a CK line and a WEB line; a CK line, a WEB line and a CEB line; an REB line and a WEB line; or an REB line, a WEB line and a CEB line.

21. The semiconductor device according to claim 15, wherein the semiconductor device is selected from the group consisting of a DRAM, an SRAM, an FRAM, a masked ROM, a PROM, an EPROM, an EEPROM and a flash memory.

22. A semiconductor device comprising:
a memory unit, comprising:
- a data holding unit having a plurality of memory cells;
- an address selecting unit electrically connected to the data holding unit, having a column-decoder and a row-decoder;
- a precharge unit electrically connected to the data holding unit, having:
  - a precharge potential line;
  - a plurality of switches electrically connected to the precharge potential line; and
  - a precharge signal line electrically connected to the plurality of switches; and
- a delay unit electrically connected to the precharge signal line, having a plurality of transistors;

a central processing unit electrically connected to the delay unit and the address selecting unit;
a display unit electrically connected to the central processing unit, having a plurality of pixels;
a control unit electrically connected to the memory unit;
a power generation unit electrically connected to the memory unit and the control unit; and
a transmit and receive unit electrically connected to the control unit.

23. The semiconductor device according to claim 22, wherein each of the plurality of memory cells includes a memory element in a region where a bit line and a word line intersect each other through an insulator.

24. The semiconductor device according to claim 23, wherein the memory element is one or complement selected among a transistor, a capacitor element or a resistor element.

25. The semiconductor device according to claim 23, wherein the bit line is electrically connected to corresponding one of the plurality of switches.

26. The semiconductor device according to claim 22, wherein each of the plurality of switches is a transistor or an analog switch.

27. The semiconductor device according to claim 22, wherein input nodes of the delay unit are connected to a CK line and a WEB line; a CK line, a WEB line and a CEB line; an REB line and a WEB line; or an REB line, a WEB line and a CEB line.

28. The semiconductor device according to claim 22, wherein the semiconductor device is selected from the group consisting of a DRAM, an SRAM, an FRAM, a masked ROM, a PROM, an EPROM, an EEPROM and a flash memory.

* * * * *